United States Patent [19]

Boswell

[11] Patent Number: 4,810,935

[45] Date of Patent: Mar. 7, 1989

[54] METHOD AND APPARATUS FOR PRODUCING LARGE VOLUME MAGNETOPLASMAS

[75] Inventor: Roderick W. Boswell, Australian Capital Territory, Australia

[73] Assignee: The Australian National University, Australian Capital Territory, Australia

[21] Appl. No.: 2,616

[22] PCT Filed: May 2, 1986

[86] PCT No.: PCT/AU86/00121

§ 371 Date: Jan. 27, 1987

§ 102(e) Date: Jan. 27, 1987

[87] PCT Pub. No.: WO86/06923

PCT Pub. Date: Nov. 20, 1986

[30] Foreign Application Priority Data

May 3, 1985 [AU] Australia .................. PH0419

[51] Int. Cl.$^4$ .............................................. H05H 1/46
[52] U.S. Cl. ............................... 315/111.41; 313/156; 313/161; 313/231.31; 313/552; 315/34; 315/111.21; 315/176; 315/344
[58] Field of Search ............... 315/39, 111.81, 111.41, 315/111.51, 111.71, 34, 111.21, 344, 176; 313/156, 161, 231.31, 154, 552

[56] References Cited

U.S. PATENT DOCUMENTS

| | | | |
|---|---|---|---|
| 3,437,864 | 4/1969 | Kofoid et al. .................. | 315/111.81 |
| 4,438,368 | 3/1984 | Abe et al. ....................... | 315/39 |
| 4,574,179 | 3/1986 | Masuzawa et al. ......... | 315/111.81 X |
| 4,631,438 | 12/1986 | Jacquot ....................... | 315/111.71 X |
| 4,645,977 | 2/1987 | Kurokawa et al. ............ | 315/111.21 |

Primary Examiner—David K. Moore
Assistant Examiner—Mark R. Powell
Attorney, Agent, or Firm—Harness, Dickey & Pierce

[57] ABSTRACT

A large volume magnetoplasma is created by (a) establishing a plasma in an electrically isolated, tubular cavity formed by a cylinder (10) containing a source of ions and electrons at low pressure, into which rf energy is coupled by an antenna (32) alongside the cavity; and (b) allowing the plasma to extend into an adjoining auxiliary region (20) which is connected to the cavity (10). Preferably the operating conditions in the cavity (10) are such that the production of atomic species in the plasma is enhanced. The enhancement occurs when the operating conditions satisfy the relationships $$D.W.p \approx 15,000 \qquad \text{(I)}$$

and $$10 \leq \frac{f.L^2}{B} \leq 100 \qquad \text{(II)}$$

where W is the power in watts applied to the antenna (32), D is the diameter of the plasma cavity (10) in cm, p is the pressure in the cavity (10) (and in the auxiliary region (20)) expressed in millitorr, f is the frequency of the rf power in MHz, L is the length of the antenna (32) in cm and B is the magnetic field in the cavity (10), established by a coil (13) which surrounds the cavity, expressed in gauss. The large plasmas so produced are suitable for dry etching of semiconductor materials such as silicon wafers, for etching of polymers and for the surface treatments of other materials.

16 Claims, 2 Drawing Sheets

METHOD AND APPARATUS FOR PRODUCING LARGE VOLUME MAGNETOPLASMAS

TECHNICAL FIELD

This invention concerns the generation of plasmas. More particularly, it concerns the generation of high density plasmas at low pressures. The invention is especially useful for the generation of large volume plasmas in insulating cavities for use in dry etching applications and in the modification of surface properties of materials, but it is not limited to these applications.

BACKGROUND ART

The use of plasmas for etching and other purposes is well known. A convenient reference paper on plasma etching is the paper by Paul J. Marcoux entitled "Dry etching—an overview", published in *Hewlett Packard Journal*, Aug. 1982, pages 19 to 23.

The equipment that is used to produce a plasma consists of:

(a) an electrically isolated chamber, usually called a discharge tube (within which the plasma is generated);
(b) a vacuum pump (for creating and maintaining a low pressure in the discharge tube);
(c) a supply of gas (for flushing air from the discharge tube and to provide a source of the ions and electrons which form the plasma);
(d) a radio-frequency oscillator, amplifier and coupling network (as a source of power to establish the plasma); and
(e) an antenna for coupling the rf power from the output of the coupling network into the plasma.

Normally, the plasma tube is a metal cylinder of circular cross-section. However, cylinders of pyrex and quartz glass have been used by the present inventor (see the publications referred to below, in this paragraph). Among the antennas used to couple the rf power into the plasma, the most effective is a double loop antenna, which fits tightly against the sides of the discharge tube (see, for example, the experimental equipment described in the papers by (a) R. W. Boswell, in *Physics Letters*, Volume 33A, December 1970, pages 457 and 458, (b) R. W. Boswell et al in *Physics Letters*, Volume 91A, September 1982, pages 163 to 166, and (c) R. W. Boswell in *Plasma Physics and Controlled Fusion*, Volume 26, pages 1147 to 1162, 1984).

DISCLOSURE OF THE PRESENT INVENTION

It has been recognised for some time that more efficient production of silicon chips (and other semiconductor devices) for computers could be achieved if the area of the silicon wafer (or the wafer of the other semiconductor material) that is etched to form the chips could be increased. Efficient production of high density plasmas of larger volume (that is, in a discharge tube of greater internal diameter) has been theoretically possible, but has not been achieved in practice prior to the development of the present invention. Furthermore, the production of a larger volume plasma would be of little benefit unless this plasma is substantially uniform and has a reasonably high density of the non-charged atomic species (usually fluorine) which are used to perform the etching.

It is an object of the present invention to provide the means for producing a plasma which has a significantly larger volume than has been produced previously, and which has a substantially uniform volume of non-charged atomic species.

This objective is achieved by establishing the plasma in a cavity which is connected to an adjoining auxiliary region, at the same internal pressure as the cavity, into which the plasma extends. In a preferred form of the present invention, the plasma is established at a much lower pressure than has been used previously, and under resonance conditions (discovered by the present inventor) which result in the production of a high volume of atomic gas species.

With regard to the basic form of the present invention, the present inventor has found that if a plasma is generated in a plasma tube that is connected to an auxiliary region at the same low pressure as the plasma tube, then the plasma extends into that auxiliary region. The auxiliary region may have a volume that is substantially larger than the volume of the plasma. A sample to be etched can be supported in the plasma tube or (preferably) in the auxiliary region, where it will be contacted by the plasma.

With regard to the low pressure operation of the plasma the present inventor has found, in the course of the application of his previous scientific work (see the aforementioned scientific papers) to the field of dry etching of semiconductor materials, that if a gas (such as sulphur hexafluoride) which contains reactive species is used for dry etching of silicon, there is a substantial increase in the etching rate of the silicon in a given discharge tube configuration, for a given rf power input, under certain conditions. Subsequent experimental work by the inventor has resulted in an empirical determination of the conditions under which this unexpected resonance effect will occur. These conditions, for an input rf power frequency of 7.5 MHz, an antenna length of 20 cm and a magnetic field of 100 gauss, can be expressed by the formula $$D.W.p = 15,000 \qquad (I)$$

where D is the internal diameter (in cm) of the tube in which the plasma is generated, W is the rf power (in watts), and p is the operating pressure of the plasma tube (in millitorr).

The present inventor has also established that in order to achieve this resonance condition, the length (L) of the antenna, the magnetic field (B) within the plasma tube and the frequency (f) of the rf power are interdependent, and that $$10 \leq \frac{f \cdot L^2}{B} \leq 100 \qquad (II)$$

where f is in MHz, L is in cm and B is in gauss.

When the resonance condition in the plasma tube is achieved, it is believed that there is an increase in the interaction between the ions and electrons in the plasma and the uncharged gas molecules. This means that the dissociation of the gas to produce atomic species is greatly increased, thus increasing the density of the atomic species within the plasma tube. When the plasma gas is sulphur hexafluoride $SF_6$ (which is commonly used for plasma etching of silicon wafers), the dissociation is believed to be into atomic sulphur and atomic fluorine. The atomic fluorine interacts with any exposed silicon in the plasma tube, or in the auxiliary region, to etch it.

Thus according to the present invention, there is provided apparatus for producing a plasma which comprises (a) an electrically isolated, elongate, tubular cavity of uniform circular cross-section of diameter D, containing a gaseous source of ions and electrons at a pressure p;
(b) first magnetic field-establishing means, external to the cavity, for establishing a magnetic field B within the cavity;
(c) a radio-frequency antenna of length L, adapted to couple rf power into the gas within the cavity; and
(d) a source of rf power of frequency f, external to the cavity, coupled to the antenna; the apparatus being characterised in that it includes
(e) an electrically isolated auxiliary region connected to the cavity and at the same internal pressure as the cavity; and
(f) second magnetic field-establishing means for establishing a required magnetic field configuration within the auxiliary region.

In the preferred form of this invention the parameters for the operation of the apparatus are defined by the relationships $$D.W.p \simeq 15,000 \qquad \text{(I)}$$

and $$10 \leq \frac{f.L^2}{B} \leq 100 \qquad \text{(II)}$$

(where W is the output power in watts of the source of rf power, D is expressed in cm, p is in millitorr, f is in MHz, L is in cm and B is in gauss).

Also according to the present invention, there is provided a method of producing a large magnetoplasma comprising (a) establishing a plasma in an electrically isolated, elongate, tubular cavity of uniform circular cross-section of diameter D, containing a gaseous source of ions and electrons at a pressure p, by establishing a magnetic field B within the cavity and coupling rf power of frequency f into the gaseous source using a radio-frequency antenna of length L located external to the cavity; and
(b) allowing the plasma to extend into an auxiliary region having the same internal pressure p as the cavity and connected to the cavity.

In this aspect of the present invention, it is also preferred to have the operating conditions of the plasma so that the following two relationships apply:

$$D.W.p \simeq 15,000 \qquad \text{(I)}$$

and $$10 \leq \frac{f.L^2}{B} \leq 100 \qquad \text{(II)}$$

(where W is the power in watts applied to the radio-frequency antenna, D is expressed in cm, p is in millitorr, f is in MHz, L is in cm and B is in gauss).

Using this apparatus and method, a significant increase in the density of atomic species derived from the gas within the cavity is obtained upon establishment of the plasma.

Under typical operating conditions, the value of (f.L²/B) is preferably about 50.

Under normal circumstances, the pressure p within the cavity and the adjoining auxiliary region will be maintained at a substantially constant value by balancing the supply rate of the gas against the pumping speed of a vacuum pump.

An embodiment of the present invention will now be described, by way of example only, with reference to the accompanying drawings.

DETAILED DESCRIPTION OF ILLUSTRATED EMBODIMENT

Figure 1:
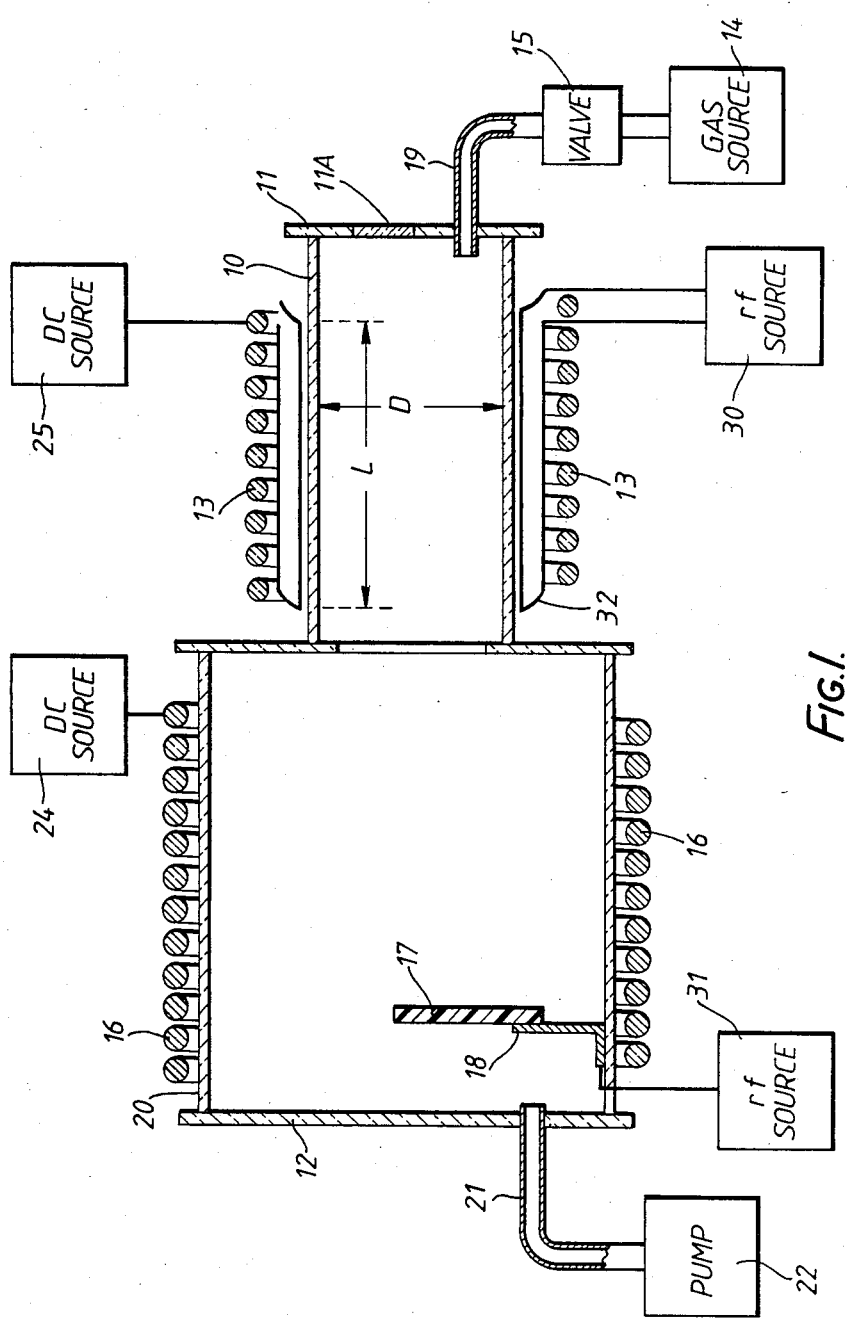
FIG. 1 is a partly schematic and partly sectional view, from one side, of a plasma etching apparatus constructed to include the present invention.

The apparatus illustrated in FIG. 1 consists of a ceramic or glass cylinder 10 which has a circular cross-section of internal diameter D, and which is connected to an adjoining auxiliary region in the form of a second ceramic or glass cylinder 20. Cylinder 10 and cylinder 20 may be formed integrally. The cylinder 10 is closed at its end remote from cylinder 20 by a flange 11 which may have one or more observation windows 11A sealed into it. A source of gas 14 is connected by tube 19, via valve 15 and flange 11 to the inside of cylinder 10. A tube 21 extends from inside cylinder 20, through a flange 12 (which seals the end of cylinder 20 which is remote from cylinder 10) to a vacuum pump 22.

A coil 13 surrounds the cylinder 10. Coil 13 is connected to a DC source 25 to establish a magnetic field B within cylinder 10. The uniformity of the plasma that is established within the cavity formed by cylinder 10 can be controlled, if required, by varying the diameter of the coil 13 along its length.

Figure 2:
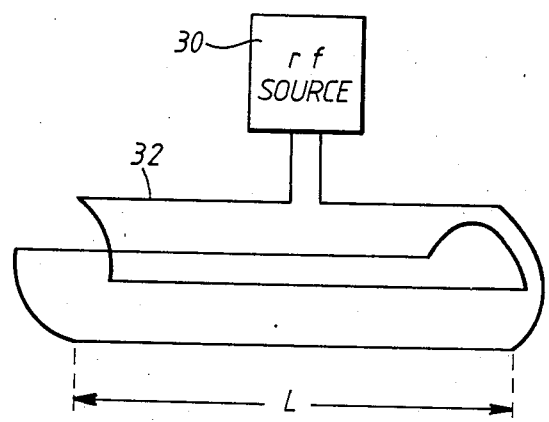
FIG. 2 is a representation of the preferred antenna configuration for coupling rf power to the plasma.

A radio frequency power generator 30 and matching network has its output coupled to an antenna 32 which, in turn, resonantly couples the rf power into the gaseous medium within the cylinder 10. The generator 30 may produce power at any frequency in the range from about 1 MHz to about 30 MHz. The antenna 32 can be any suitable form of rf antenna, but must have a length L which enables the resonance formulae I and II to be satisfied. Antennas with various lengths and diameters have been tested by the present inventor with complete success. The preferred form of antenna (which was used in the earlier, published work of the present inventor) is illustrated in FIG. 2. As shown in FIG. 1, the antenna 32 is placed under coil 13, and adjacent to the wall of cylinder 10.

Figure 3:
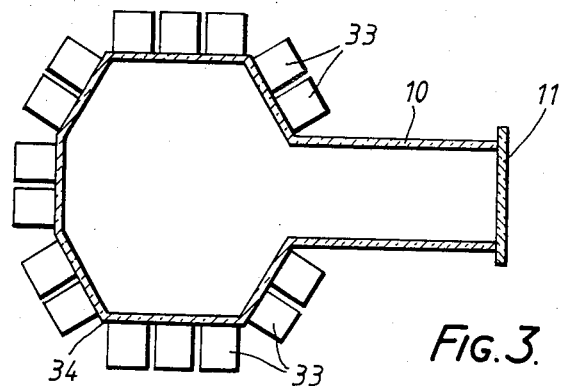
FIG. 3 shows one of many alternative configurations for the plasma cavity and the adjoining auxiliary region.

The auxiliary region created by cylinder 20 need not be cylindrical in shape, but may have any required configuration. Since the plasma created within the cavity formed by cylinder 10 extends into the auxiliary region, the auxiliary region is provided with means to constrain the extended region of the plasma—namely, means to establish an appropriate magnetic field in the auxiliary region. If the auxiliary region is a cylinder, this magnetic field can be established, as shown in FIG. 1, with a coil 16 connected to a second DC source 24. If the auxiliary region has a complex shape, such as that illustrated in FIG. 3, a series of permanent magnets 33 may be mounted adjacent to the wall 34 which defines the auxiliary region, in known manner, to establish a magnetic "fence" which contains the plasma within the auxiliary region.

If the plasma is to be used for etching purposes, the material 17 to be etched—for example, a wafer of silicon, covered with a mask to permit a matrix comprising a large number of silicon chips to be etched simultaneously—is supported within the plasma cavity (cylinder 10) or, preferably, as shown in FIG. 1, within the auxiliary region by support 18. Support 18 may be connected to a second rf source 31, which provides a biassing potential to the support 18.

To use this equipment, the cylinder 10 and the cylinder 20 are first flushed with gas from source 14. The cavity is then pumped out by vacuum pump 22 until a pressure of 0.01 millitorr or less has been established within the cavity and the auxiliary region. Thereafter, a higher pressure, defined by the resonance relationship of equation I, is maintained within the cavity by balancing the gas flow from the source 14 and the pumping speed of the pump 22.

Figure 4:
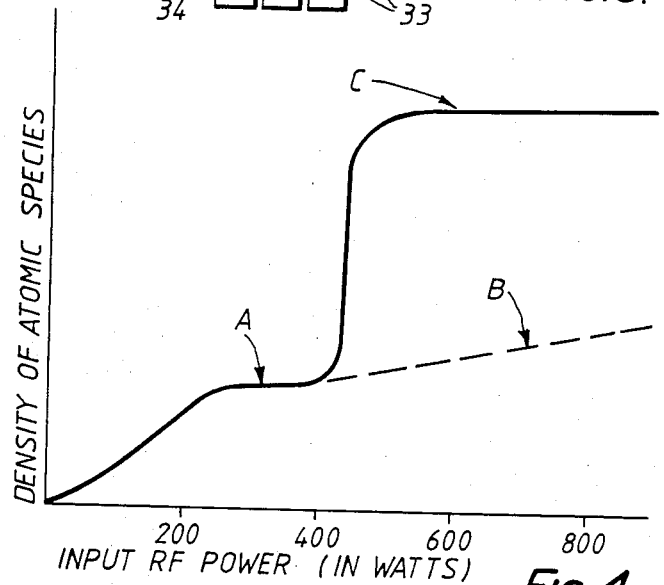
FIG. 4 is a graph showing the relationship between rf power supplied to the antenna of the apparatus of FIG. 1 and the density of atomic fluorine in the plasma tube of FIG. 1 when the gas used for the plasma is sulphur hexafluoride.

When the required pressure and magnetic field have been established within cylinder 10, and the power level from generator 21 is increased from zero, a plasma is formed and the density of atomic species increases with increase of power until it reaches the plateau value that is achieved with conventional plasma apparatus. This plateau value is shown as plateau A of the plot of FIG. 4. The conventional plasma physicist would predict that as the power from generator 21 continues to be increased, the plateau value A would be maintained, or would increase slightly, as shown by the dashed line B in FIG. 4. The present inventor has found, however, that when operating at the low pressure values required for the present invention, a resonance phenomenon occurs which results in a rapid increase in the density of atomic species produced in the cavity to a second plateau value shown by C in FIG. 4.

Because the atomic species produced within the plasma are neutral, they are unaffected by the magnetic field B established by the coil 13, or by the magnetic field established within the auxiliary region. They also have long lifetimes—generally more than 0.1 second. Thus, they are equally distributed throughout the cylinders 10 and 20, so that there is a highly uniform etch of the material 17. An additional benefit of this substantially equal distribution of the atomic species is that the location of the material being etched or surface treated by the plasma is not critical, and it can be situated almost anywhere within the auxiliary region (or within cylinder 10, if desired).

The etching angle at material 17 can be varied by applying an appropriate rf voltage and frequency to bias the substrate of the material 17. If the RMS amplitude of this bias voltage is a few volts, isotropic etching of the material 17 is achieved. If the bias voltage has an RMS amplitude of a few tens to a few hundred volts, anisotropic etching of material 17 occurs. At intermediate bias voltage amplitudes, various degrees of etching anisotropy, in proportion to the amplitude of the biasing rf voltage, are produced.

The gas from source 14 may be a single component gas or a mixture of gases. It will be selected according to the type of etching or surface treatment of material 17 that is required.

When the apparatus of the present invention is to be used for etching purposes, such as the aforementioned production of computer chips from silicon wafers, the gas from source 14 will normally be a gas which dissociates to produce a reactive atomic species (such as sulphur hexafluoride ($SF_6$), carbon tetrafluoride ($CF_4$) or carbon tetrachloride ($CCl_4$)), or a mixture of gases which includes at least one gas that dissociates to produce reactive atomic species which are especially useful for etching.

However, as noted above, the apparatus of the present invention is not limited in its application to the etching of semiconductor materials. By substituting oxygen as the working gas, very high etch rates of polymers such as photoresist can be achieved. If the plasma gas is nitrogen, neutral nitrogen atoms are generated, which can be used to surface harden steel, by forming a nitride on the surface. Using experimental equipment, a very hard surface coating has been formed on steel samples having a length of up to several meters.

In his work in this field, the present inventor has used the double cylinder arrangement illustrated in FIG. 1, with the internal diameter of the cylinder 10 ranging from 2 cm to 20 cm, and with the internal diameter of the adjoining cylinder 20 ranging from 2 cm to 80 cm. The resonance plateau C indicated in FIG. 4 has been observed with each configuration that has been used. With the larger diameter cylinders, operating at pressures in the range from about 0.1 millitorr to about 1.0 millitorr, an increased volume plasma, suitable for use in the etching of large diameter silicon wafers, has been obtained.

Although specific embodiments of the present invention have been described above, it will be appreciated that the present invention is not limited to those embodiments, and that various modifications and variations may be made without departing from the present inventive concept.

I claim:

1. A method of producing a large magnetoplasma comprising establishing a plasma in an electrically isolated, elongate, tubular cavity of uniform circular cross-section of diameter D, containing a gaseous source of ions and electrons at a pressure p, by establishing a magnetic field B within the cavity and coupling rf power of frequency f into the gaseous source using a radio-frequency antenna of length L located external to the cavity; allowing said plasma to extend into an auxiliary region having the same internal pressure as said cavity and being connected to said cavity and adjusting the operating conditions of the plasma so that the following two relationships apply:

$$D.W.p \simeq 15,000$$

and $$10 \leq \frac{f.L^2}{B} \leq 100$$

(where W is the power in watts applied to the radio-frequency antenna, D is expressed in cm, p is in millitorr, f is in MHz, L is in cm and B is in gauss).

2. A method as defined in claim 1, in which $$\frac{f \cdot L^2}{B} \simeq 50$$

3. A method as defined in claim 1, in which the pressure p within the cavity (10) is maintained by balancing the supply rate of said gaseous source of ions and electrons against the pumping speed of a vacuum pump (22) connected to said cavity.

4. A method as defined in claim 3 in which said gaseous source of ions is a gas that dissociates to produce a reactive atomic species or is a mixture of gases which includes at least one gas that dissociates to produce a reactive atomic species.

5. A method as defined in claim 3, in which said source of ions and electrons is selected from the group consisting of sulphur hexafluoride, carbon tetrafluoride, carbon tetrachloride, oxygen and nitrogen.

6. A method as defined in claim 1, in which said gaseous source of ions or electrons is a gas which dissociates to produce reactive halogen atoms within said cavity, and a wafer of a semiconductor material is included within said auxiliary region, whereby said wafer is etched by said halogen atoms.

7. A method as defined in claim 3, in which said gaseous source of ions and electrons is oxygen, which produces oxygen atoms upon dissociation, and a polymer is included within said auxiliary region, whereby said polymer is etched by said oxygen atoms.

8. A method as defined in claim 3, in which said gaseous source of ions and electrons is nitrogen, which dissociates within said cavity to form nitrogen atoms, and a steel product is included within said auxiliary region, whereby a nitride is formed on the surface of said steel product.

9. Apparatus for producing a plasma, said apparatus comprising an electrically isolated, elongate, tubular cavity of uniform circular cross-section of diameter D, containing a gaseous source of ions and electrons at a pressure p; first magnetic field establishing means external to the cavity for establishing a magnetic field F within the cavity; a radio-frequency antenna of length L, adapted to couple rf power into the gas within the cavity; and a source of rf power of frequency f, external to the cavity, coupled to the antenna; said apparatus being characterized in that it includes an electrically isolated auxiliary region connected to said cavity and maintained at the same internal pressure p as said cavity; second magnetic field-establishing means associated with said auxiliary region for establishing a required magnetic field configuration within said auxiliary region and wherein the parameters of the operation of the apparatus are defined by the relationships $$D.W.p \simeq 15{,}000 \qquad (I)$$

and $$10 \leq \frac{f L^2}{B} \leq 100 \qquad (II)$$

(where W is the output power in watts of the source of rf power, D is expressed is cm, p is in millitorr, f is in MHz, L is in cm and B is in gauss).

10. Apparatus as defined in claim 9, in which $$\frac{f \cdot L^2}{B} \simeq 50$$

11. Apparatus as defined in claim 9 including a vacuum pump (22) connected to said auxiliary region and a gas supply (14) connected to said cavity, said gas supply providing said gaseous source of ions, the operation of said vacuum pump and said gas supply being so adjusted that the pressure p within the cavity is maintained at a substantially constant value.

12. Apparatus as defined in claim 11, in which said gaseous source of ions and electrons is a gas that dissociates to produce a reactive atomic species or is a mixture of gases which includes at least one gas that dissociates to produce a reactive atomic species.

13. Apparatus as defined in claim 11, in which said source of ions and electrons is selected from the group consisting of sulphur hexafluoride, carbon tetrafluoride, carbon tetrachloride, oxygen and nitrogen.

14. Apparatus as defined in claim 9, 13, including a masked wafer of a semiconductor material mounted within said auxiliary region, said apparatus being further characterised in that said gaseous source of ions and electrons is a gas which dissociates within said cavity to produce halogen atoms, which etch the exposed regions of said wafer.

15. Apparatus as defined in claim 11, including a polymer material mounted within said auxiliary region, said apparatus being further characterised in that said gaseous source of ions and electrons is oxygen, which dissociates within said cavity to produce oxygen atoms which etch said polymer material.

16. Apparatus as defined in claim 11 including a steel product located within said auxiliary region, said apparatus being further characterised in that said gaseous source of ions and electrons is nitrogen, which dissociates within said cavity to form nitrogen atoms, which react with the surface of said steel product to form a nitride at said surface.

* * * * *